(12) United States Patent
Cho et al.

(10) Patent No.: US 11,385,495 B2
(45) Date of Patent: Jul. 12, 2022

(54) DISPLAY DEVICE AND METHOD OF MANUFACTURING THE SAME

(71) Applicant: SAMSUNG DISPLAY CO., LTD., Yongin-si (KR)

(72) Inventors: Young Min Cho, Yongin-si (KR); Jin Seok Son, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 96 days.

(21) Appl. No.: 16/819,569

(22) Filed: Mar. 16, 2020

(65) Prior Publication Data
US 2020/0301201 A1 Sep. 24, 2020

(30) Foreign Application Priority Data
Mar. 19, 2019 (KR) .................. 10-2019-0031285

(51) Int. Cl.
| | | |
|---|---|---|
| *G02F 1/1345* | (2006.01) | |
| *G02F 1/1335* | (2006.01) | |
| *G02F 1/1368* | (2006.01) | |
| *G02F 1/1362* | (2006.01) | |
| *H01L 27/12* | (2006.01) | |

(52) U.S. Cl.
CPC ...... *G02F 1/133528* (2013.01); *G02F 1/1368* (2013.01); *G02F 1/13452* (2013.01); *G02F 1/136286* (2013.01); *H01L 27/124* (2013.01); *H01L 27/1259* (2013.01); *G02F 1/136222* (2021.01); *G02F 2201/121* (2013.01); *G02F 2201/123* (2013.01)

(58) Field of Classification Search
CPC .......... G02F 1/133528; G02F 1/13452; G02F 1/136286; G02F 1/1368; G02F 1/136222; G02F 2201/121; H01L 27/124; H01L 27/1259
See application file for complete search history.

(56) References Cited

U.S. PATENT DOCUMENTS

| | | | |
|---|---|---|---|
| 7,009,676 B1 | 3/2006 | Kim | |
| 2006/0275989 A1* | 12/2006 | Ting ................. | G02F 1/133351 438/283 |
| 2011/0109829 A1* | 5/2011 | Mathew ............. | G02F 1/13452 349/58 |

(Continued)

FOREIGN PATENT DOCUMENTS

| | | |
|---|---|---|
| KR | 10-0472356 | 2/2005 |
| KR | 10-2016-0028550 | 3/2016 |
| KR | 10-2020-0021577 | 3/2020 |

OTHER PUBLICATIONS

Restriction Requirement dated Oct. 18, 2021 in Related U.S. Appl. No. 16/514,936.

*Primary Examiner* — James A Dudek
(74) *Attorney, Agent, or Firm* — F. Chau & Associates, LLC

(57) ABSTRACT

A method of manufacturing a display device includes disposing a polarizing layer on one surface of a display panel including a thin film transistor and a pixel electrode, cutting the polarizing layer using a first laser beam so that a step between a side surface of the polarizing layer and a side surface of the display panel is smaller than a predetermined value, attaching a conductive film to the side surface of the display panel, and patterning the conductive film using a second laser beam.

14 Claims, 13 Drawing Sheets

(56) References Cited

U.S. PATENT DOCUMENTS

| | | | |
|---|---|---|---|
| 2017/0338441 A1* | 11/2017 | Higano | H01L 27/124 |
| 2018/0061367 A1* | 3/2018 | Ye | G09G 3/3677 |
| 2018/0173042 A1 | 6/2018 | Kim et al. | |
| 2020/0057323 A1 | 2/2020 | Son et al. | |

* cited by examiner

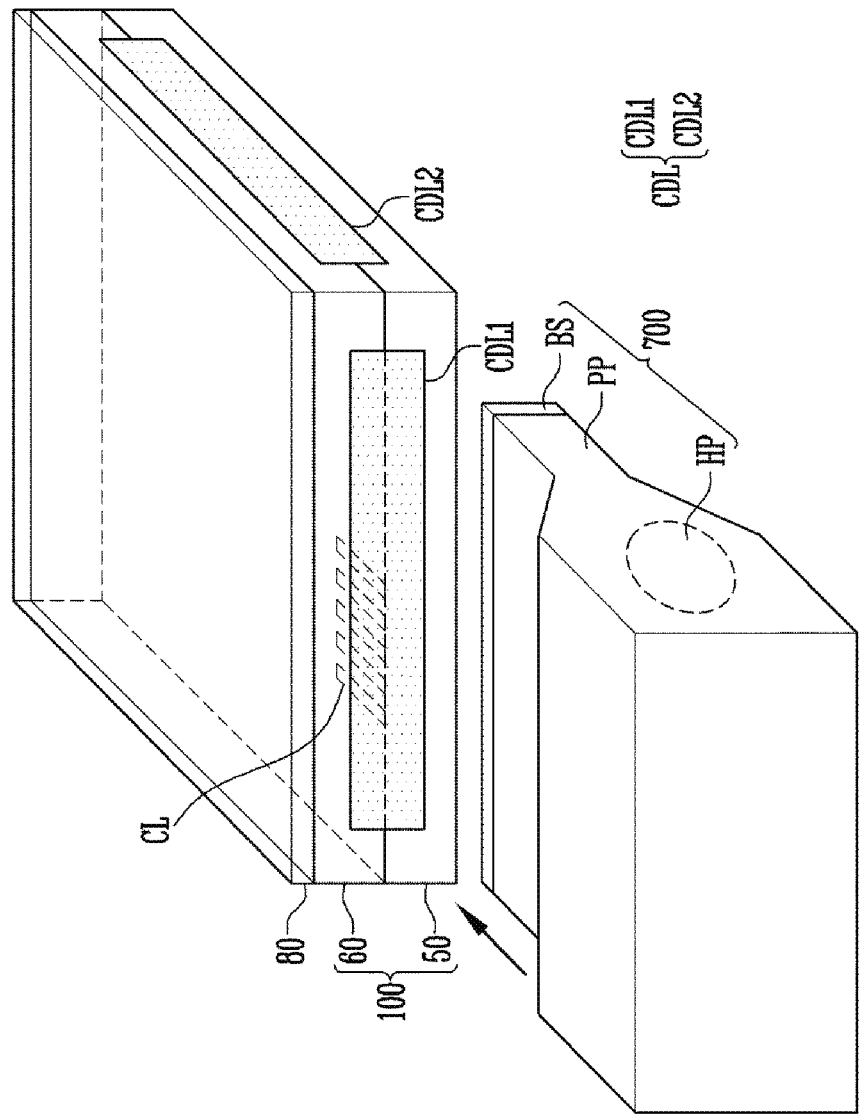

DISPLAY DEVICE AND METHOD OF MANUFACTURING THE SAME

CROSS-REFERENCE TO RELATED APPLICATION

The application claims priority under 35 U.S.C. § 119 to Korean Patent Application No. 10-2019-0031285, filed on Mar. 19, 2019 in the Korean Intellectual Property Office, the disclosure of which is incorporated by reference herein in its entirety.

TECHNICAL FIELD

Exemplary embodiments of the inventive concept relate to a display device and a method of manufacturing the same.

DISCUSSION OF RELATED ART

Recently, the display field has rapidly developed in line with the information age. As such, different types of flat panel display device that are thinner, lighter, and use less power have been developed, including liquid crystal displays (LCD), plasma display panels (PDP), electroluminescence displays (ELD), field emission displays (FED), and the like.

In certain situations, one image may be displayed on a plurality of display panels in an outdoor display, an electric signboard, or the like. In this case, a connection portion between the display panels may be visually recognized due to the bezels of the display panels, and immersion in the displayed image may be reduced. Accordingly, it may be desirable to minimize the bezels of the display panels while displaying an ultra-high resolution image across multiple display panels. Likewise, it may be desirable to minimize bezels of display panels for high-resolution small-sized and medium-sized display devices, such as mobile devices.

SUMMARY

According to an exemplary embodiment of the inventive concept, a method of manufacturing a display device may include disposing a polarizing layer on one surface of a display panel including a thin film transistor and a pixel electrode, cutting the polarizing layer using a first laser beam so that a step between a side surface of the polarizing layer and a side surface of the display panel is smaller than a predetermined value, attaching a conductive film to the side surface of the display panel, and patterning the conductive film using a second laser beam.

In an exemplary embodiment of the inventive concept, attaching the conductive film may include pressing a conductive layer and a base layer on the conductive layer with a first pressure at a first temperature so that the conductive film contacts the side surface of the display panel, where the conductive layer and the base layer constitute the conductive film, removing the base layer from the conductive layer, and pressing the conductive layer with a second pressure at a second temperature to bond the conductive layer to the side surface of the display panel.

In an exemplary embodiment of the inventive concept, the second temperature may be higher than the first temperature.

In an exemplary embodiment of the inventive concept, the second pressure may be higher than the first pressure.

In an exemplary embodiment of the inventive concept, the conductive layer may be bonded to the side surface of the display panel by a bonding apparatus including a heating unit heated to the second temperature and a pressing unit in the form of a bar for pressing the conductive film with the second pressure.

In an exemplary embodiment of the inventive concept, a pressing apparatus in the form of a roller or a bar may press the conductive film with the first pressure at the first temperature so that the conductive film contacts the side surface of the display panel.

In an exemplary embodiment of the inventive concept, the conductive layer may include at least one selected from silver (Ag), copper (Cu), gold (Au), and aluminum (Al).

In an exemplary embodiment of the inventive concept, attaching the conductive film to the side surface of the display panel may include bonding the conductive film to the side surface of the display panel under a predetermined temperature and a predetermined pressure condition.

In an exemplary embodiment of the inventive concept, the display panel may further include a common electrode disposed on the pixel electrode, and a color filter disposed on the common electrode.

In an exemplary embodiment of the inventive concept, patterning the conductive film may form a plurality of side conductive patterns electrically connected to at least one of the thin film transistor, the pixel electrode, the common electrode, and the color filter.

In an exemplary embodiment of the inventive concept, a distance between the plurality of side conductive patterns may be 30 µm or less.

In an exemplary embodiment of the inventive concept, the method may further include attaching an anisotropic conductive film to the plurality of side conductive patterns so that a driving circuit and a printed circuit board are electrically connected to the plurality of side conductive patterns.

In an exemplary embodiment of the inventive concept, cutting the polarizing layer may include inhaling impurities generated in response to cutting the polarizing layer, and cleaning the side surface of the display panel with atmospheric pressure plasma.

In an exemplary embodiment of the inventive concept, the method may further include conveying the display panel in a direction substantially parallel to the one surface of the display panel along a predefined conveyor line. As the display panel is being conveyed, the polarizing layer is disposed on the one surface of the display panel, the polarizing layer is cut, the conductive film is attached on the side of the display panel, and the conductive film is patterned in sequential order.

According to an exemplary embodiment of the inventive concept, a method of manufacturing a display device may include attaching a conductive film to at least one side surface of a display panel in which a pixel including a thin film transistor and a light emitting element is provided, patterning the conductive film using a laser beam to form a plurality of side conductive patterns electrically connected to the pixel, and attaching an anisotropic conductive film to the plurality of side conductive patterns to electrically connect a driving circuit to the plurality of side conductive patterns.

In an exemplary embodiment of the inventive concept, attaching the conductive film may include pressing a conductive layer and a base layer on the conductive layer with a first pressure at a first temperature so that the conductive film contacts the at least one side surface of the display panel, where the conductive layer and the base layer constitute the conductive film, removing the base layer from the conductive layer, and pressing the conductive layer with a second pressure at a second temperature to bond the conductive layer to the at least one side surface of the display panel.

In an exemplary embodiment of the inventive concept, the second temperature may be higher than the first temperature and the second pressure may be higher than the first pressure.

According to an exemplary embodiment of the inventive concept, a display device may include a display panel including a plurality of pixels each defined by a gate line and a data line, and connection lines connected to the plurality of pixels, and a driving circuit electrically connected to the display panel through the connection lines. A plurality of side conductive patterns for electrically connecting the plurality of pixels and the driving circuit may be disposed on a bonding side corresponding to at least one side surface of the display panel, the connection lines and the plurality of side conductive patterns may be respectively bonded at an end portion corresponding to the at least one side surface of the display panel, and the connection lines and the plurality of side conductive patterns may include different conductive materials.

In an exemplary embodiment of the inventive concept, the display device may further include an anisotropic conductive film attached to the plurality of side conductive patterns. A first portion of the anisotropic conductive film may be attached to the plurality of side conductive patterns, and the driving circuit may be connected to a second portion of the anisotropic conductive film.

In an exemplary embodiment of the inventive concept, a distance between the plurality of side conductive patterns may be 30 μm or less.

BRIEF DESCRIPTION OF THE DRAWINGS

The above and other features of the inventive concept will be more fully understood by describing in detail exemplary embodiments thereof with reference to the accompanying drawings.

DETAILED DESCRIPTION OF THE EMBODIMENTS

Figure 1:
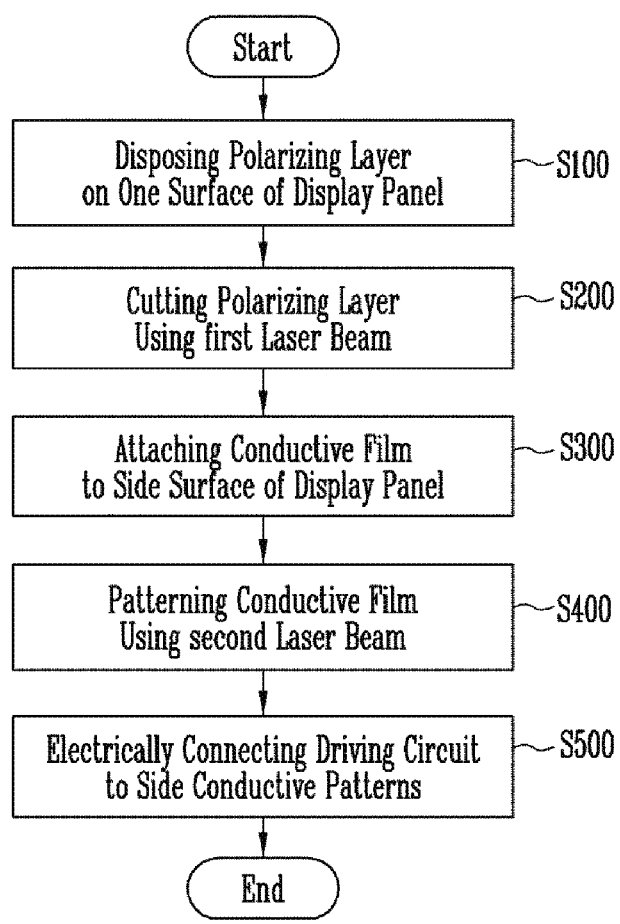
FIG. 1 is a flowchart illustrating a method of manufacturing a display device according to an exemplary embodiment of the inventive concept.

Exemplary embodiments of the inventive concept provide a method of manufacturing a display device capable of forming an ultra-fine conductive pattern on a side surface of a display panel of the display device.

Exemplary embodiments of the inventive concept also provide a display device including a display panel having a side surface on which an ultra-fine conductive pattern is formed.

Hereinafter, exemplary embodiments of the inventive concept will be described in detail with reference to the accompanying drawings. Like reference numerals may refer to like elements throughout this application.

FIG. 1 is a flowchart illustrating a method of manufacturing a display device according to an exemplary embodiment of the inventive concept.

Referring to FIG. 1, a method of manufacturing a display device may include an operation of disposing a polarizing layer on one surface of a display panel (S100), an operation of cutting the polarizing layer using a first laser beam, for example, a cutting laser beam (S200), an operation of attaching a conductive film to a side surface of the display panel (S300), an operation of patterning the conductive film using a second laser beam, for example, a patterning laser beam (S400), and an operation of electrically connecting a driving circuit to side conductive patterns formed by patterning the conductive film (S500).

In an exemplary embodiment of the inventive concept, the display device may be a liquid crystal display (LCD). Hereinafter, a liquid crystal display device will be described as an example of the display device. However, the inventive concept is not limited thereto. For example, the display device may be a plasma display panel (PDP), an organic light emitting diode (OLED), a field effect display (FED), an electrophoretic display, or the like.

The display device manufactured by the method may have a side surface from which a step between the polarizing layer and the display panel is eliminated. In addition, side conductive patterns connected to an internal circuit of the display panel may be formed on the side surface where the step is eliminated by an ultra-precision laser technique. Accordingly, a driving circuit for driving the display device may be electrically connected to the side surface of the display panel by a side bonding method.

In a conventional display device, an electrode is extended on an upper surface of a substrate on which thin film transistors are formed, an anisotropic conductive film or the like is attached to the electrode, and a driving chip, a printed circuit board (PCB), or the like are attached to the anisotropic conductive film by a chip on film (COF) method. Thus, a side step may be generated between a polarizing layer and a display panel (substrate including a thin film transistor or the like), and a bezel is formed. In addition, light leakage may be visually recognized due to the side step between the polarizing layer and the display panel. To prevent the light leakage, a chassis, a frame, a black matrix, or the like may be formed on an outside of the display panel. Thus, conventional display devices have reached a limit in terms of reducing the width of the bezel on the outside.

The display device and the method of manufacturing the same according to an exemplary embodiment of the inventive concept may eliminate the step between the polarizing layer and the display panel. A zero-bezel may be realized by connecting the display panel and the driving circuit by the side bonding method, and a large-sized display having ultrahigh resolution over UHD (ultra-high definition) or more may be realized by ultrafine laser patterning. In addition, an adhesive strength between the side conductive patterns and the side surface of the display panel may be increased by pressing the conductive film on the side surface of the display panel and an electrical connection between the side conductive patterns and the conductive film of the display panel may be improved.

Figure 2:
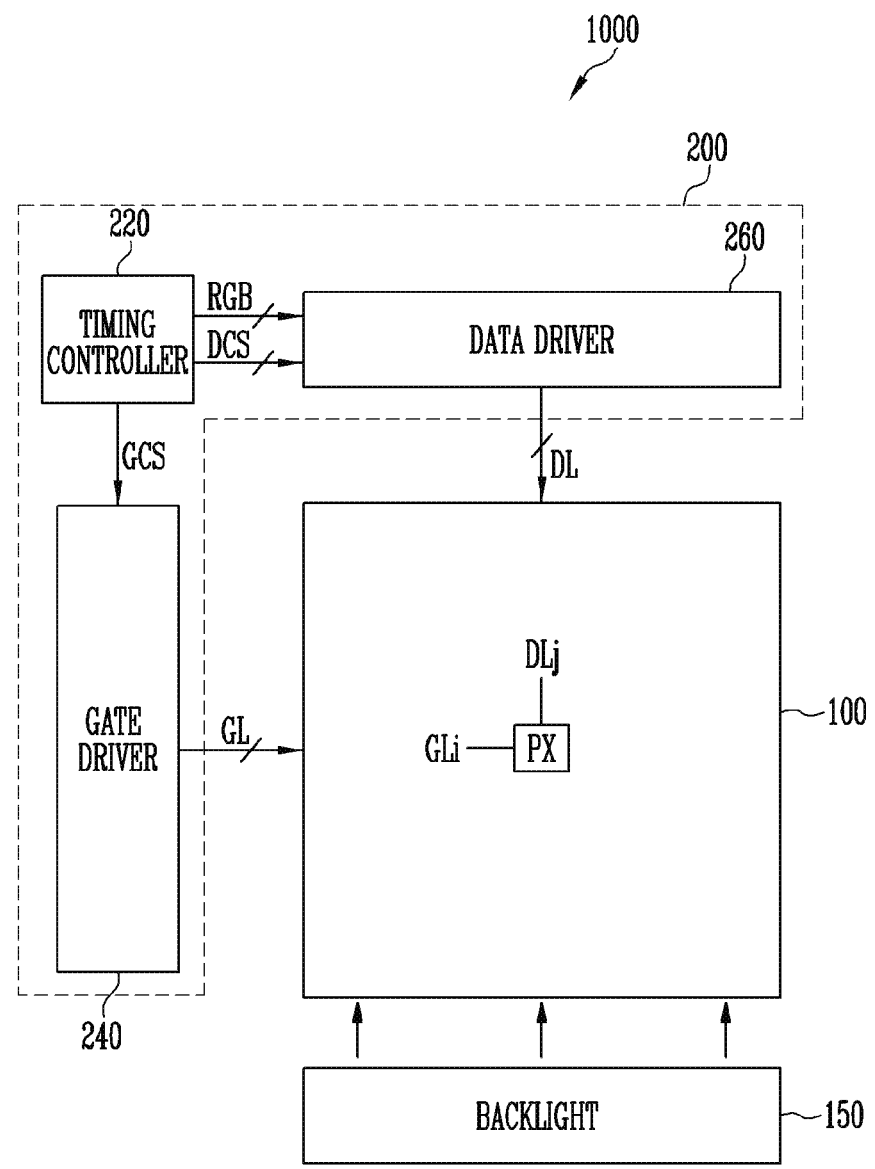
FIG. 2 is a block diagram illustrating a display device according to an exemplary embodiment of the inventive concept.

FIG. 2 is a block diagram illustrating a display device according to an exemplary embodiment of the inventive concept.

Referring to FIG. 2, a display device 1000 may include a display panel 100 and a driving circuit 200. In an exemplary embodiment of the inventive concept, the display panel 100 may be a liquid crystal panel, and the display device 1000 may further include a backlight 150.

The display panel 100 may include a plurality of gate lines GL extending in a first direction, for example, a horizontal direction (row direction). A plurality of data lines DL extending in a second direction intersecting the first direction, for example, a vertical direction (column direction), may be disposed on the display panel 100.

Each pixel PX may be defined by a gate line GLi and a data line DLj intersecting each other, where i and j are natural numbers. Each pixel PX of the display panel 100 may include a thin film transistor, a liquid crystal capacitor, and a storage capacitor. In an exemplary embodiment of the inventive concept, each pixel PX may display light of one of red, green, and blue colors.

The backlight 150 may supply light to the display panel 100. The backlight 150 may include a cold cathode fluorescent lamp (CCFL), an external electrode fluorescent lamp (EEFL), a light emitting diode (LED), or the like as a light source.

The driving circuit 200 may include a timing controller 220, a gate driver 240, and a data driver 260.

The timing controller 220 may receive image data from an external graphic source such as a TV system or a video card, and receive control signals such as a vertical synchronization signal, a horizontal synchronization signal, a main clock signal, and a data enable signal. The timing controller 220 may generate a data control signal DCS for controlling the data driver 260 based on the control signals. The data control signal DCS may include a source start pulse SSP, a source sampling clock SSC, a source output enable signal SOE, a polarity signal POL, or the like. In addition, the timing controller 220 may receive image data RGB, align the image data RGB, and transmit the image data RGB to the data driver 260.

The timing controller 220 may generate a gate control signal GCS for controlling the gate driver 240 in response to the control signals.

The data driver 260 may supply a data voltage to the data lines DL in response to the data control signal DCS and the image data RGB.

The gate driver 240 may sequentially select the gate lines GL in response to the gate control signal GCS supplied from the timing controller 220 and may output a turn-on voltage to the selected gate line.

The thin film transistor connected to the selected gate line may be turned on by the turn-on voltage.

Figure 3:
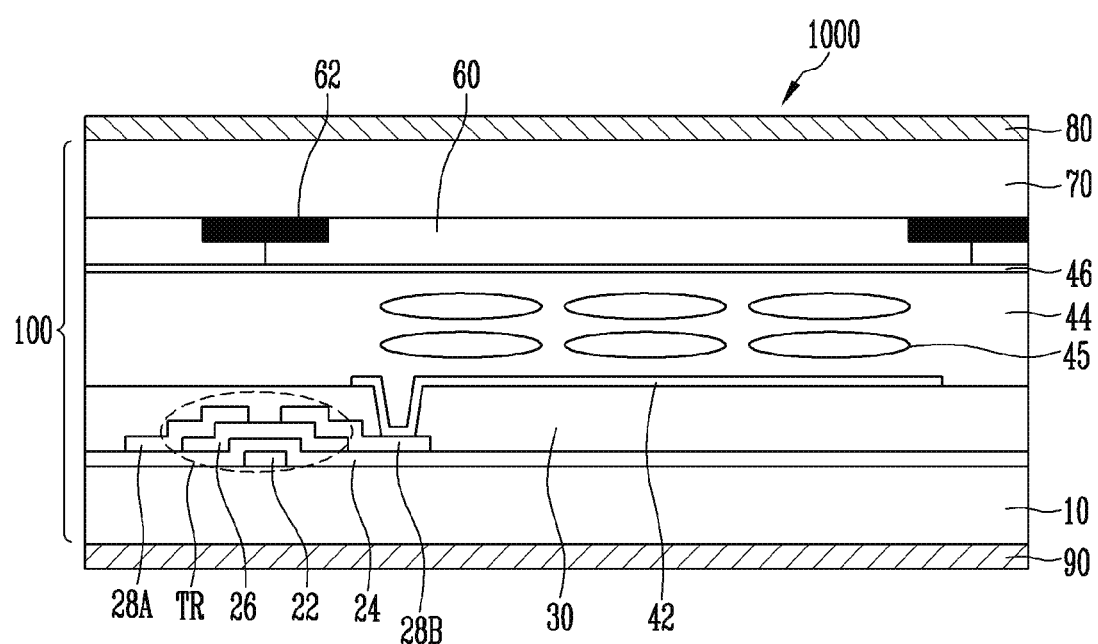
FIG. 3 is a cross-sectional view schematically illustrating a display device according to an exemplary embodiment of the inventive concept.

FIG. 3 is a cross-sectional view schematically illustrating a display device according to an exemplary embodiment of the inventive concept.

Referring to FIG. 3, the display device 1000 may include the display panel 100 and polarizing layers 80 and 90. FIG. 3 shows a part of a cross-section of the display device 1000.

The display panel 100 may include a first substrate 10, a second substrate 70, and a liquid crystal layer 44 between the first substrate 10 and the second substrate 70.

In an exemplary embodiment of the inventive concept, the display panel 100 may include the first substrate 10 for providing a thin film transistor TR and a pixel electrode 42, the second substrate 70 for providing a common electrode 46 and a color filter 60, and the liquid crystal layer 44 disposed between the first substrate 10 and the second substrate 70.

For example, a gate electrode 22 may be formed on the first substrate 10, and a gate insulating layer 24 may be formed on the gate electrode 22. A semiconductor layer 26 may be formed on the gate insulating layer 24 corresponding to the gate electrode 22, and a source electrode 28A and a drain electrode 28B may be formed on the semiconductor layer 26 to be spaced apart from each other.

The gate electrode 22, the semiconductor layer 26, the source electrode 28A, and the drain electrode 28B may constitute the thin film transistor TR. Although the thin film transistor TR with a bottom gate structure is shown in FIG. 3, the inventive concept is not limited thereto. For example, the thin film transistor TR may be formed in a top gate structure.

A protective layer 30 may be formed on an upper portion of the thin film transistor TR and the pixel electrode 42 connected to the drain electrode 28B may be formed on the protective layer 30.

The common electrode 46 may be formed over the pixel electrode 42. In an exemplary embodiment of the inventive concept, the liquid crystal layer 44 including liquid crystal molecules 45 may be provided between the pixel electrode 42 and the common electrode 46.

The color filter 60 may be formed on the common electrode 46. In an exemplary embodiment of the inventive concept, a black matrix 62 may be provided in a recess of the color filter 60. In an exemplary embodiment of the inventive concept, a protective layer (overcoat layer) may be further disposed between the common electrode 46 and the color filter 60.

When the thin film transistor TR is turned on according to a gate signal applied to the gate electrode 22, a data signal may be applied to the pixel electrode 42 through the thin film transistor TR, and an electric field may be generated between the pixel electrodes 42 and the common electrode 46. The liquid crystal molecules 45 of the liquid crystal layer 44 may be rearranged according to the electric field so that the pixel PX may emit light of a grayscale level corresponding to the data signal.

In an exemplary embodiment of the inventive concept, the thin film transistor TR, the pixel electrode 42, and the common electrode 46 may be extended through conductive lines (or connection lines), respectively, and electrically connected to the side conductive patterns formed on the side surface of the display panel 100.

In an exemplary embodiment of the inventive concept, the thin film transistor TR, the pixel electrode 42, and the common electrode 46 may be provided on the first substrate 10 and the color filter 60 may be provided on the second substrate 70. The liquid crystal layer 44 may be disposed between the first substrate 10 and the second substrate 70. In this case, the liquid crystal molecules 45 may be arranged in a horizontal direction, for example, an in-plane switching (IPS) mode, a plane to line switching (PLS) mode, a fringe field switching (FFS) mode, etc.

In an exemplary embodiment of the inventive concept, the thin film transistor TR, the pixel electrode 42, the common electrode 46, and the color filter 60 may be provided on the first substrate 10 (for example, a color filter on array (COA) structure). The liquid crystal layer 44 and the second substrate 70 may be sequentially arranged on the color filter 60.

In an exemplary embodiment of the inventive concept, the polarizing layers 80 and 90 may be disposed on upper and lower surfaces of the display panel 100, respectively. For example, the first polarizing layer 80 may be disposed on the upper surface of the second substrate 70, and the second polarizing layer 90 may be disposed on the lower surface of the first substrate 10. In an exemplary embodiment of the inventive concept, the first and second polarizing layers 80 and 90 may be provided in the form of a polarizing film.

However, the inventive concept is not limited thereto. The display device 1000 may have only one of the first and second polarizing layers 80 and 90.

In an exemplary embodiment of the inventive concept, polarization axes of the first and second polarizing layers 80 and 90 may be orthogonal to each other.

FIGS. 4 to 7 are diagrams illustrating the method of manufacturing the display device of FIG. 1 according to an exemplary embodiment of the inventive concept.

Referring to FIGS. 1 to 7, a method of manufacturing the display device 1000 may include an operation of disposing a polarizing layer 80A on an upper surface of the display panel 100 (S100), an operation of cutting the polarizing layer 80A (S200), and an operation of cleaning the side surface of the display panel 100 with atmospheric pressure plasma.

The polarizing layer 80A may be disposed on the upper surface of the display panel 100 on which the thin film transistor TR, the pixel electrode 42, the common electrode 46, the liquid crystal layer 44, and the color filter 60 are formed (S100). The display panel 100 may include the first substrate 10, the second substrate 70, and the liquid crystal layer 44 between the first substrate 10 and the second substrate 70.

In an exemplary embodiment of the inventive concept, the thin film transistor TR and the pixel electrode 42 may be provided on the first substrate 10, and the common electrode 46 and the color filter 60 may be provided on the second substrate 70.

In an exemplary embodiment of the inventive concept, the thin film transistor TR, the pixel electrode 42, and the common electrode 46 may be provided on the first substrate 10 and the color filter 60 may be provided on the second substrate 70.

In an exemplary embodiment of the inventive concept, the thin film transistor TR, the pixel electrode 42, the common electrode 46, and the color filter 60 may be provided on the first substrate 10.

Hereinafter, in the description with reference to FIGS. 4 to 13, the components included in the display panel 100 are divided into a liquid crystal panel 50 and the color filter 60 for the sake of convenience. For example, the liquid crystal panel 50 may include the first substrate 10, the thin film transistor TR, the pixel electrode 42, the common electrode 46, and the liquid crystal layer 44. In addition, the color filter 60 may further include the second substrate 70 provided on the color filter 60.

The display panel 100 may be in a cut state by scribing a raw substrate with a diamond cutter or a laser cutter. Therefore, the flatness of the side surface of the display panel 100 is low, and impurities may exist in the side surface of the display panel 100.

Figure 4:
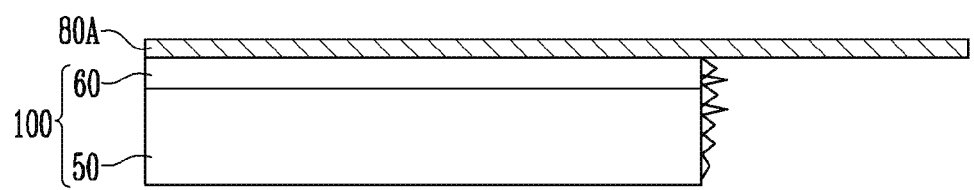
FIGS. 4 to 7 are diagrams illustrating the method of manufacturing the display device of FIG. 1 according to an exemplary embodiment of the inventive concept.

The polarizing layer 80A may be attached to the color filter 60. In FIG. 4, the polarizing layer 80A is disposed on the color filter 60, but the inventive concept is not limited thereto. For example, the polarizing layer 80A may be disposed on the upper and lower surfaces of the display panel 100 so that the polarization axes thereof are orthogonal to each other at 90 degrees.

In an exemplary embodiment of the inventive concept, the operation of disposing the polarizing layer 80A may include a cleaning process of removing foreign matter from the display panel 100, a process of aligning the polarizing layer 80A with the display panel 100 and then attaching the polarizing layer 80A while peeling a protective film, and an autoclave process for removing bubbles between the polarizing layer 80A and the display panel 100 and for increasing an adhesive strength.

A sectional area of the polarizing layer 80A may be larger than that of the display panel 100 to improve the adhesive strength between the polarizing layer 80A and the display panel 100.

Thereafter, the polarizing layer 80A may be cut (S200) so that a side surface of the polarizing layer 80A and the side surface of the display panel 100 are aligned.

Figure 5:
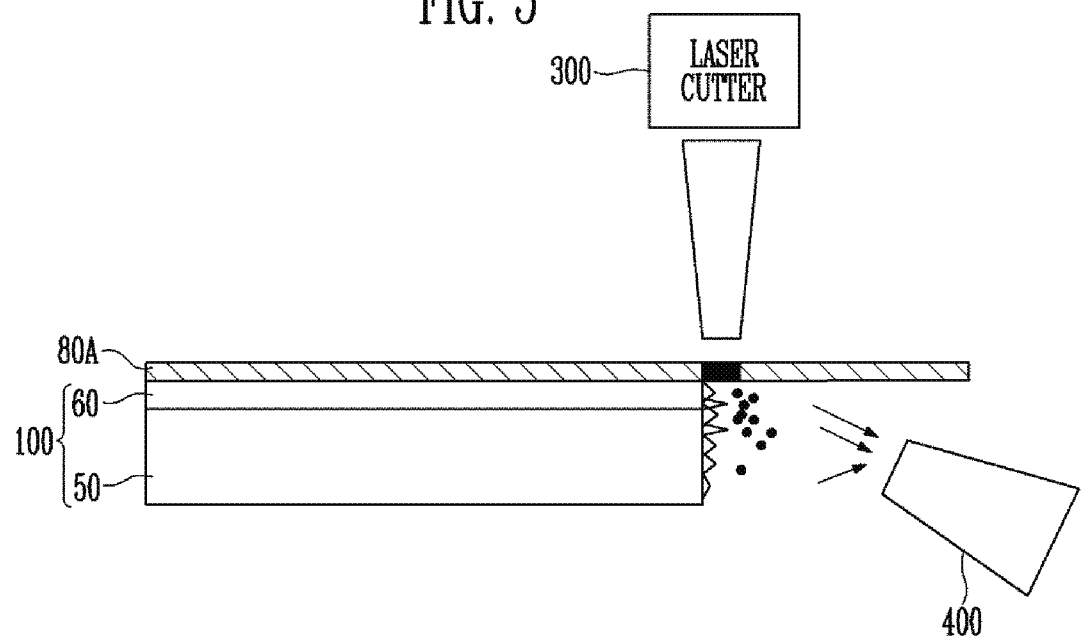

In an exemplary embodiment of the inventive concept, as shown in FIG. 5, the side surface of the display panel 100 may be polished at substantially the same time as the polarizing layer 80A is cut by the cutting laser beam (or first laser beam). At substantially the same time, residues and impurities produced by the cutting and polishing process may be inhaled.

The cutting laser beam may be output from a predetermined laser cutting device 300. For example, the cutting laser beam may be a femtosecond laser beam and may be implemented with a gas laser such as a helium-neon (He—Ne) laser or a carbon dioxide (CO2) laser at infrared wavelengths.

The cutting laser beam may be precisely irradiated to the polarizing layer 80A and the side surface of the display panel 100 corresponding thereto. The side surface of the polarizing layer 80A cut by the cutting laser beam and the side surface of the display panel 100 may be planarized. In other words, a step between the side surface of the polarizing layer 80A and the side surface of the display panel 100 may be eliminated. For example, the step between the side surface of the polarizing layer 80A and the side surface of the display panel 100 may be 100 μm or less. Ideally, the step between the side surface of the polarizing layer 80A and the side surface of the display panel 100 may be zero.

Conventionally, an edge grinding method has been used as a cutting method for planarizing a side surface of a substrate. The edge grinding method is expensive in terms of facility cost, it is difficult to form a step within 200 μm, and a damage rate of the display panel is relatively high due to physical impact.

However, in the cutting and polishing process (S200) using the cutting laser beam according to exemplary embodiments of the inventive concept, the step between the side surface of the polarizing layer 80A and the side surface of the display panel 100 may be reduced to 100 μm or less at low cost, and a strength of an edge portion may be increased. For example, the step between the side surface of the polarizing layer 80A and the side surface of the display panel 100 may be 50 µm or less.

By cutting the polarizing layer 80A and polishing the display panel 100, foreign matter such as residues and fumes may be generated, and the side surface of the display panel 100 may be contaminated. Accordingly, an inhaling device may be provided, and the fumes may be inhaled to prevent contamination.

In FIG. 5, the laser cutting process is performed on only one side surface of the display panel 100, but the inventive concept is not limited thereto. The cutting and polishing process may be performed on other side surfaces of the display panel 100.

Figure 6:
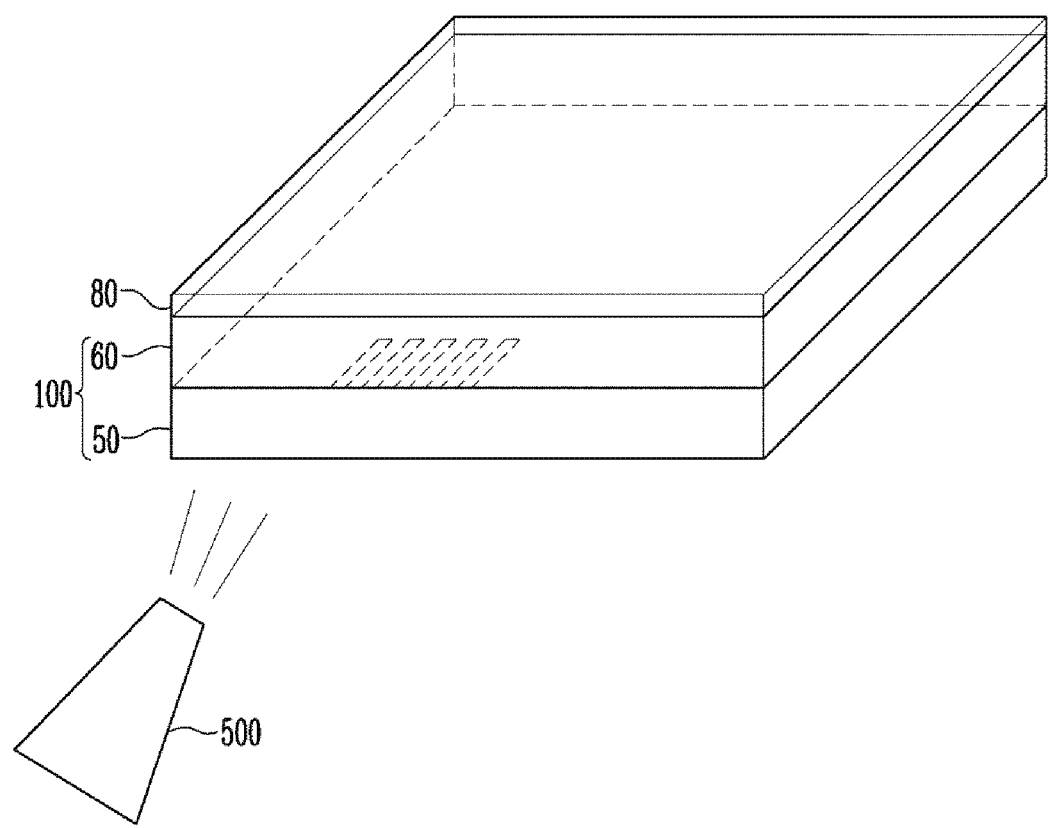

As shown in FIG. 6, the side surface of the display panel 100 may be cleaned by atmospheric pressure plasma using a plasma cleaning apparatus 500. Contaminants such as organic matter remaining on the side surface of the display panel 100 may be removed once more by a plasma cleaning process. In addition, the side surface of the display panel 100 may be provided with a hydrophilic function to lower the contact angle. Thus, an adhesive strength between a conductive paste and the side surface of the display panel 100 may be increased.

Figure 7:
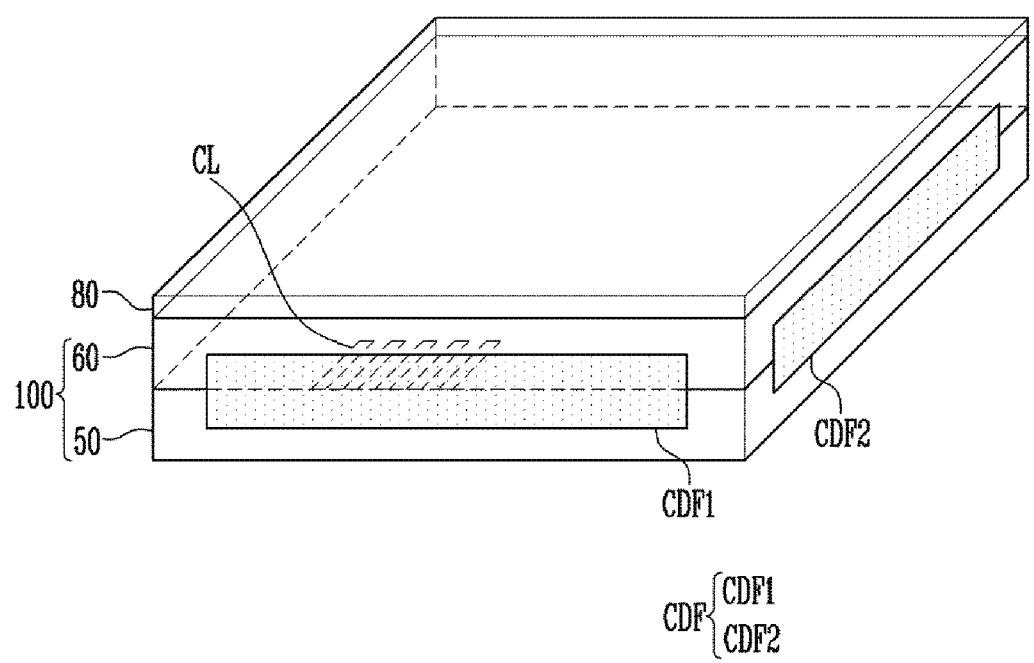

As shown in FIG. 7, a conductive film CDF may be attached to at least one side surface of the display panel 100. For example, the conductive film CDF in the form of a film or a thin film may be attached (adhered) to the side surface of the display panel 100 on which the plasma cleaning process has been performed by using a thermal press bonding facility or the like.

A first conductive film CDF1 may be disposed on the first side of the display panel 100 and a second conductive film CDF2 may be disposed on the second side of the display panel 100. However, the arrangement of the conductive films is not limited thereto. For example, a plurality of conductive films may be disposed on one side surface of the display panel 100, and conductive films may be disposed on other side surfaces of the display panel 100. Hereinafter, when it is necessary to describe the first and second conductive films CDF1 and CDF2 as a single entity, the term "conductive film CDF" will be used.

An attachment region to which the conductive film CDF is attached may include a part of one side surface of the display panel 100. For example, the attachment region may be an area including a part of the liquid crystal panel 50 and a part of the color filter 60. The attachment region may correspond to only a part of the liquid crystal panel 50.

The attachment region may be formed to be in contact with a plurality of connection lines CL formed on the liquid crystal panel 50. Each of the connection lines CL may be connected to at least one of the thin film transistor TR, the pixel electrode 42, the common electrode 46, and the color filter 60. In addition, each of the connection lines CL may be extended from at least one of the thin film transistor TR, the pixel electrode 42, the common electrode 46, and the color filter 60 to an end corresponding to one side surface of the liquid crystal panel 50 or the display panel 100. Accordingly, the first and second conductive films CDF1 and CDF2 and the connection lines CL may contact with each other. The connection lines CL may include at least one selected from the group consisting of copper (Cu), titanium (Ti), and aluminum (Al).

The first and second conductive films CDF1 and CDF2 may include a metal material having a high electrical conductivity. In an exemplary embodiment of the inventive concept, the first and second conductive films CDF1 and CDF2 may include at least one of silver (Ag), copper (Cu), gold (Au), and aluminum (Al).

The materials included in the connection lines CL and the first and second conductive films CDF1 and CDF2 are not limited thereto.

Figure 8A:
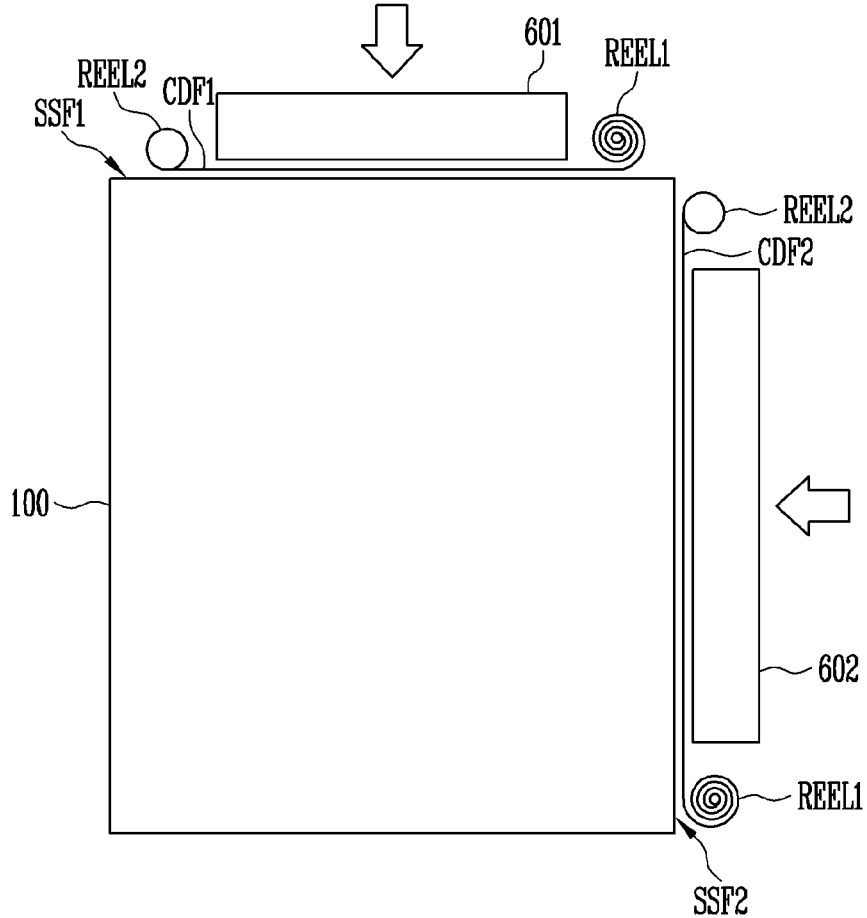
FIGS. 8A, 8B, and 8C are plan views illustrating the method of manufacturing the display device of FIG. 7 according to exemplary embodiments of the inventive concept.
Figure 8B:
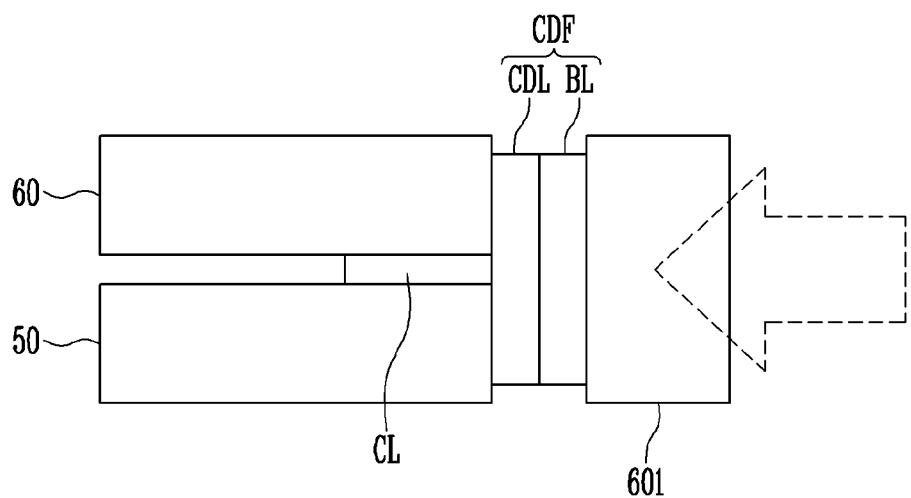
Figure 8C:
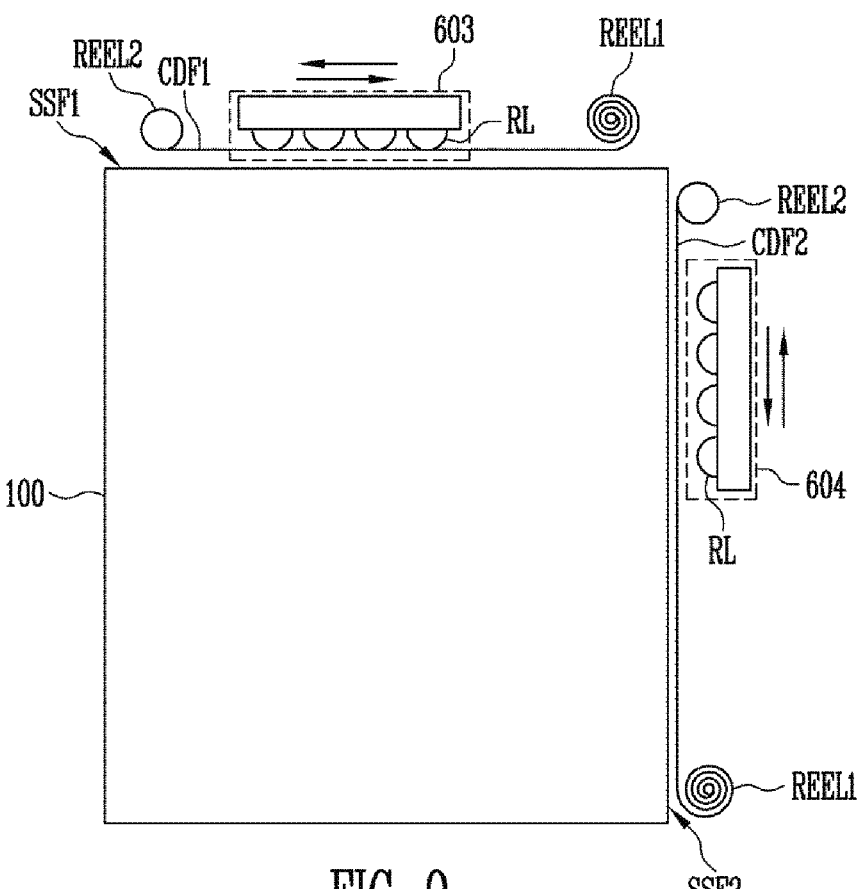

FIGS. 8A, 8B, and 8C are plan views illustrating examples of the method of manufacturing the display device of FIG. 7 according to exemplary embodiments of the inventive concept.

Referring to FIGS. 7, 8A, 8B, and 8C, the conductive film CDF may be attached to at least one side surface of the display panel 100.

In an exemplary embodiment of the inventive concept, the conductive film CDF may be heated at a first temperature and pressed to a second pressure to be attached to the side surface of the display panel 100.

As shown in FIG. 8A, in an exemplary embodiment of the inventive concept, at the first temperature, pressing apparatuses 601 and 602 in the form of a bar may press the first and second conductive films CDF1 and CDF2 against a first side surface SSF1 and a second side surface SSF2 of the display panel 100, respectively.

The first conductive film CDF1 may be wound around a first reel REEL1 in the form of a roller. The first conductive film CDF1 may be connected between the first reel REEL1 and a second reel REEL2 and aligned corresponding to the first side surface SSF1 of the display panel 100 by the rotation of the first and second reels REEL1 and REEL2.

When the first pressing apparatus 601 presses the first conductive film CDF1 against the first side surface SSF1 of the display panel 100 with the first pressure at the first temperature, the first conductive film CDF1 may be adhered to the first side surface SSF1 with weak adhesion. The first pressing apparatus 601 may include a pressing unit having a bar shape and a heating unit for providing a predetermined temperature to the pressing unit contacting the first conductive film CDF1. Accordingly, the first conductive film may be attached to the first side surface SSF1 of the display panel 100 at the first temperature and the first pressure. For example, the first temperature may be about 70° C., and the first pressure may be about 1 Mpa. In other words, the first temperature and the first pressure may be a relatively low temperature and low pressure.

In an exemplary embodiment of the inventive concept, as shown in FIG. 8B, the first conductive film CDF1 may include a conductive layer CDL (or metal film) directly contacting the first side surface SSF1 of the display panel 100 and a base layer BL (or base film) for protecting the conductive layer CDL. The conductive layer CDL may include at least one selected from silver (Ag), copper (Cu), gold (Au), and aluminum (Al). The base layer BL may include a polymeric organic material having elasticity. For example, the base layer BL may be a PET film or the like. The base layer BL may protect the conductive layer CDL wound on the first reel REEL1.

The process of weakly adhering the first conductive film CDF1 to the first side surface SSF1 of the display panel 100 using the first pressing apparatus 601 may include a process of aligning the first conductive film CDF1 with the first side surface SSF1 of the display panel 100. Accordingly, the first conductive film CDF1 may be attached to the first side surface SSF1 of the display panel 100 within a predetermined margin range. The first conductive film CDF1 may be in contact with one end of each of the connection lines CL.

The second pressing apparatus 602 and the process for attaching the second conductive film CDF2 to the second side surface SSF2 of the display panel 100 may be substantially the same as the first pressing apparatus 601 and the process for attaching the first conductive film CDF1. Therefore, redundant description will be omitted.

In an exemplary embodiment of the inventive concept, as shown in FIG. 8C, at the first temperature, pressing apparatuses 603 and 604 in the form of a roller may press the first and second conductive films CDF1 and CDF2 against the first side surface SSF1 and the second side surface SSF2 of the display panel 100 respectively with the first pressure. Each of the pressing apparatuses 603 and 604 may include at least one roller RL for pressing the first and second conductive films CDF1 and CDF2. The first and second conductive films CDF1 and CDF2 may be contacted (pre-attached) to the first and second side surfaces SSF1 and SSF2 of the display panel 100 by a reciprocating motion of the roller RL.

FIGS. 9 to 13 are diagrams illustrating the method of manufacturing the display device of FIG. 1 according to an exemplary embodiment of the inventive concept.

Referring to FIGS. 9 to 13, the method of manufacturing the display device may further include an operation of removing the base layer BL from the conductive layer CDL and an operation of pressing the conductive layer CDL against the display panel 100 with the second pressure at a second temperature to bond the conductive layer CDL and the display panel 100.

Figure 9:
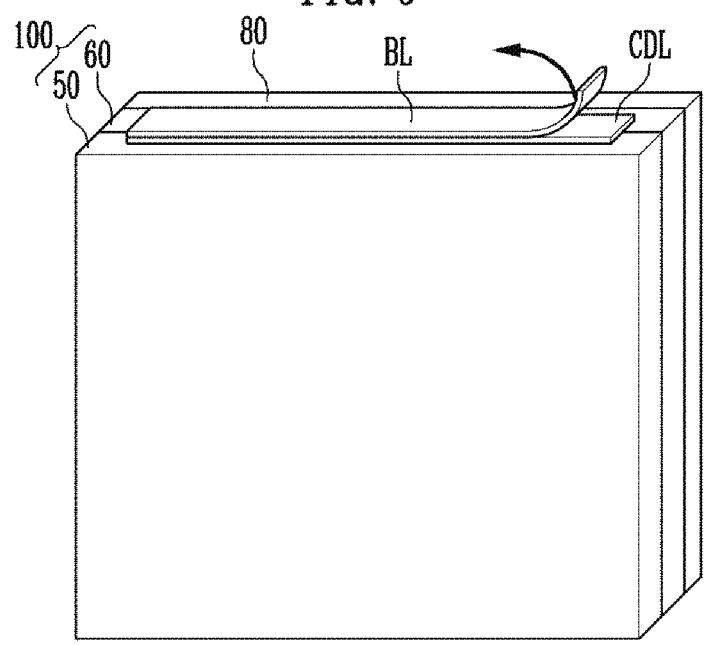
FIGS. 9 to 13 are diagrams illustrating the method of manufacturing the display device of FIG. 1 according to an exemplary embodiment of the inventive concept.

As shown in FIG. 9, the base layer BL attached to one side surface of the display panel 100 may be separated from the conductive layer CDL. The base layer BL, bonded to the conductive layer CDL by an adhesive or the like with a weak adhesive strength, may be removed from the conductive layer CDL.

In an exemplary embodiment of the inventive concept, the base layer BL may be physically peeled off from the conductive layer CDL by a peeling apparatus. In addition, the base layer BL may be removed by a chemical method to completely remove a part of the base layer BL remaining on the display panel 100.

Figure 10B:
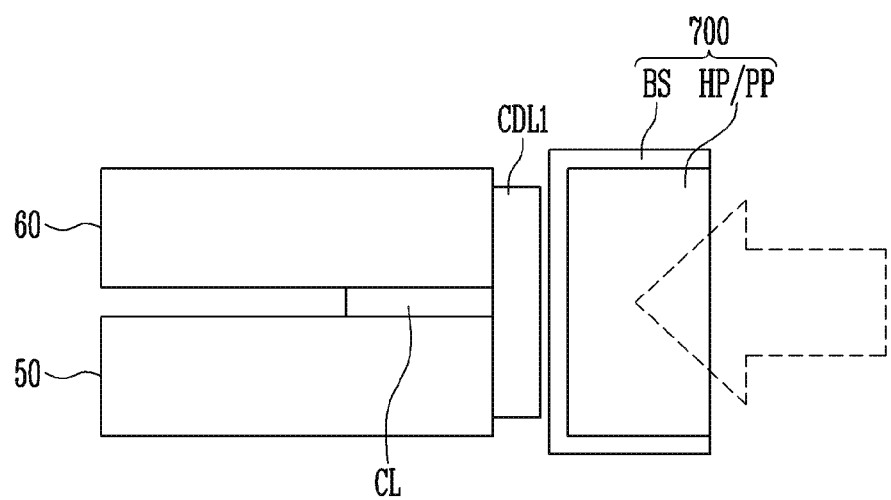

As shown in FIGS. 10A and 10B, at the second temperature, the first conductive layer CDL1 may be pressed with the second pressure and bonded to the display panel 100. In an exemplary embodiment of the inventive concept, the first conductive layer CDL1 may be bonded to the display panel 100 with a strong adhesive strength by a bonding apparatus 700 including a pressing unit PP having a bar shape. Here, the first conductive layer CDL1 may be a conductive layer included in the first conductive film CDF1.

FIG. 10A shows only the bonding apparatus 700 for bonding the first conductive layer CDL1 to the display panel 100. In an exemplary embodiment of the inventive concept, a second conductive layer CDL2 may be bonded to the other side surface of the display panel 100 by the bonding apparatus 700 or another bonding apparatus.

Hereinafter, when it is necessary to describe the first and second conductive layers CDL1 and CDL2 as a single entity, the term "conductive layer CDL" will be used.

The bonding apparatus 700 may include the pressing unit PP having the bar shape and a heating unit HP for heating the pressing unit PP. The heating unit HP may heat the pressing unit PP at the second temperature and the pressing unit PP may press the first conductive layer CDL1 with the second pressure for a predetermined time. In an exemplary embodiment of the inventive concept, the second temperature may be higher than the first temperature and the second pressure may be higher than the first pressure. For example, the second temperature may be at least about 180° C., and the second pressure may be at least about 4 Mpa. In other words, the bonding apparatus 700 may bond the first conductive layer CDL1 to the display panel 100 at a high temperature and the high pressure. Accordingly, an adhesive strength between the first conductive layer CDL1 and the connection lines CL in contact with the first conductive layer CDL1 may be greatly improved, and the flatness of the first conductive layer CDL1 may be improved.

In an exemplary embodiment of the inventive concept, the bonding apparatus 700 may further include a bonding sheet BS for improving the flatness of the first conductive layer CDL1. The bonding sheet BS may include a material having elasticity and heat resistance. For example, the bonding sheet BS may include silicon, polytetrafluoroethylene (PTFE), or the like.

The bonding sheet BS may be completely adhered to the first conductive layer CDL1 and the pressure applied to the first conductive layer CDL1 may be uniformly dispersed. Therefore, the flatness of the first conductive layer CDL1 may be improved and the thickness of the first conductive layer CDL1 may be made uniform. In addition, the contact between the bonding sheet BS and the bonding apparatus 700 including the pressing unit PP may prevent at least part of the first conductive layer CDL1 from being separated from the display panel 100.

FIGS. 10A and 10B show that the bonding sheet BS surrounds the pressing unit PP of the bonding apparatus 700, but the bonding sheet BS may be disposed separately from the pressing unit PP. In this case, one surface of the bonding sheet BS may contact the first conductive layer CDL1 only when the pressing unit PP presses the first conductive layer CDL1 and the other surface of the bonding sheet BS may contact the pressing unit PP.

The second conductive layer CDL2 of the second conductive film CDF2 may be formed in substantially the same manner as the first conductive layer CDL1. Thus, a duplicate description will be omitted.

In an exemplary embodiment of the inventive concept, in the operation of attaching the conductive film CDF to the side surface of the display panel 100, the operations of FIGS. 7 to 9 may be omitted. For example, the conductive layer CDL may be bonded to the side surface of the display panel 100 only at the second temperature and the second pressure. Thus, the manufacturing process may be simplified.

As described above, in the method of manufacturing the display device according to exemplary embodiments of the inventive concept, the conductive film CDF (e.g., the conductive layer CDL) having a uniform thickness may be bonded to the side surface of the display panel 100 at a high temperature and a high pressure. The adhesive strength and adhesion between the connection lines CL of the display panel 100 and the conductive layer CDL may be improved and the flatness of the conductive layer CDL may be improved. Therefore, in the display device 1000 to which the side bonding method is applied, an electrical connection between the display panel 100 and the driving circuit 200 may be improved and process reliability may be improved.

In addition, in the method of manufacturing the display device according to exemplary embodiments of the inventive concept, the conductive film CDF having uniform thickness and area may be formed on the side surface of the display panel 100 by pressing, thus improving the process speed and yield.

Figure 11:
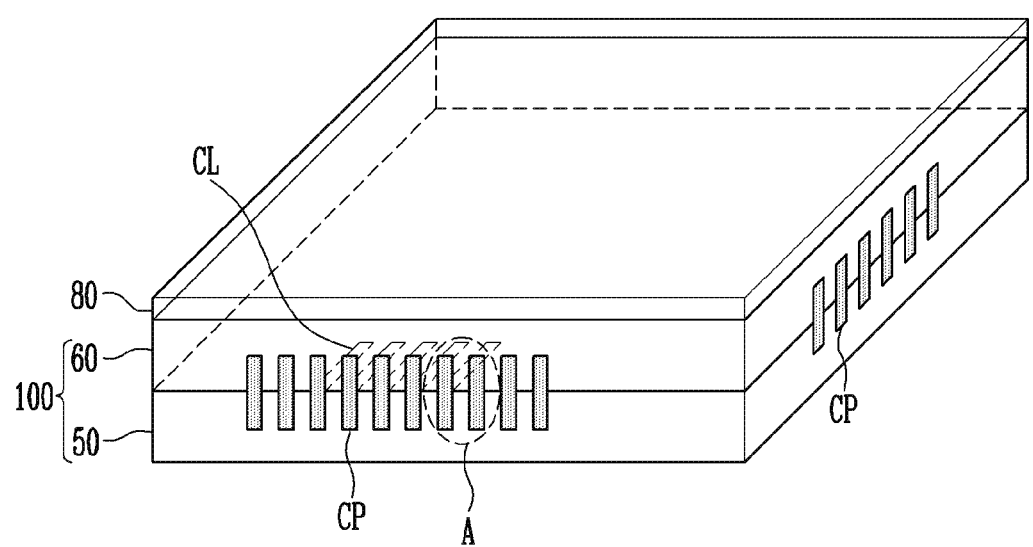
Figure 12:
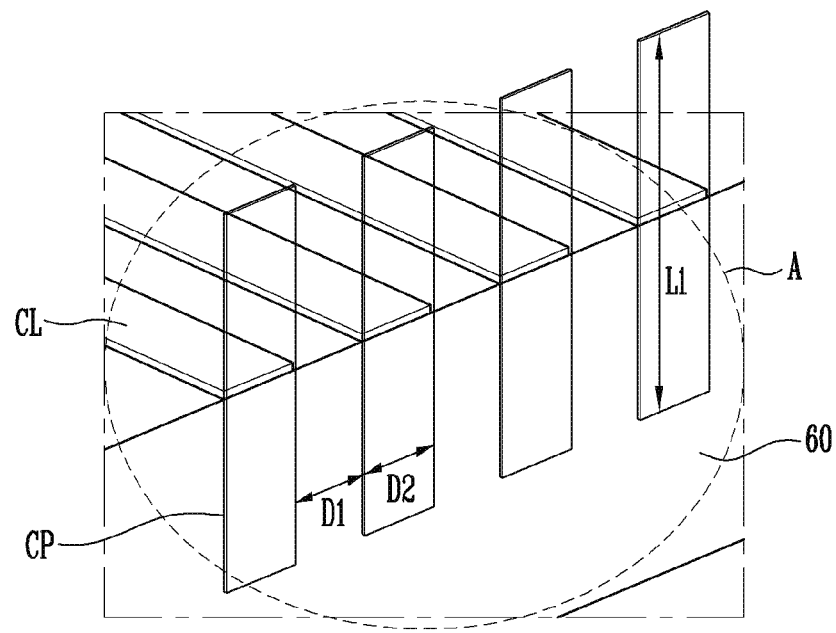

As shown in FIGS. 11 and 12 (FIG. 12 shows an area A of FIG. 11 in detail), the conductive film CDF (hereinafter, the conductive layer CDL) may be patterned (S400) by the patterning laser beam (or second laser beam). In an exemplary embodiment of the inventive concept, the patterning laser beam may have a wavelength in the infrared region to etch the conductive layer CDL. The conductive layer CDL may be patterned so that a distance between side conductive patterns CP is about 20 um or less using the patterning laser beam.

The side conductive patterns CP may be formed by laser patterning. Each of the side conductive patterns CP may be electrically connected to one of the connection lines CL. As shown in FIG. 12, one side of each of the connection lines CL is connected to one side of one of the side conductive patterns CP so that the connection lines CL and the side conductive patterns CP may be electrically coupled to one another.

In an exemplary embodiment of the inventive concept, the connection lines CL and the side conductive patterns CP may include different conductive materials. For example, the connection lines CL may include copper or an aluminum alloy, and the side conductive patterns CP may include silver.

In an exemplary embodiment of the inventive concept, a distance D1 between the side conductive patterns CP may be set to about 30 μm or less. For example, in the laser patterning process, the distance D1 between the side conductive patterns CP may be patterned to about 150 μm corresponding to a full HD resolution, and the distance D1 between the side conductive patterns CP may be patterned to about 50 μm corresponding to UHD and 4k UHD resolutions. In addition, in the laser patterning process, the distance D1 between the side conductive patterns CP may be patterned to about 25 μm corresponding to a resolution of 8k UHD or higher. In other words, the distance between the side conductive patterns CP may be relatively easily controlled corresponding to an interval between the pixels (or the connection lines CL) formed in the display panel 100, the number of pixels, or the like.

In an exemplary embodiment of the inventive concept, a width D2 of each of the side conductive patterns CP may be within the range of about 2 μm to about 4 μm. In an exemplary embodiment of the inventive concept, a length L1 (in a longitudinal direction) of each of the side conductive patterns CP may be within the range of about 500 μm to about 900 μm. This is merely an example, and the length L1 of each of the side conductive patterns CP may be any length smaller than that of the display panel 100.

By the laser patterning, a portion of the conductive film CDF in a region where the conductive film CDF other than the side conductive patterns CP is attached may be removed and boundaries of the side conductive patterns CP which are close together may be clearly distinguished. According to the above laser patterning for forming the side conductive patterns CP, a jig cost may not be generated, the side conductive patterns may be precisely machined, and a production cost may be greatly reduced. In addition, the inventive concept may be effectively used for manufacturing various high-resolution display devices such as FHD, UHD, 4k UHD, 8k UHD, or the like.

On the other hand, a color difference may exist between a portion where the conductive film CDF is removed by the laser patterning and a portion where the conductive film CDF is not attached. Further, the portion where the conductive film CDF is removed may be insulated from the portions where the conductive film CDF is not removed.

Figure 13:
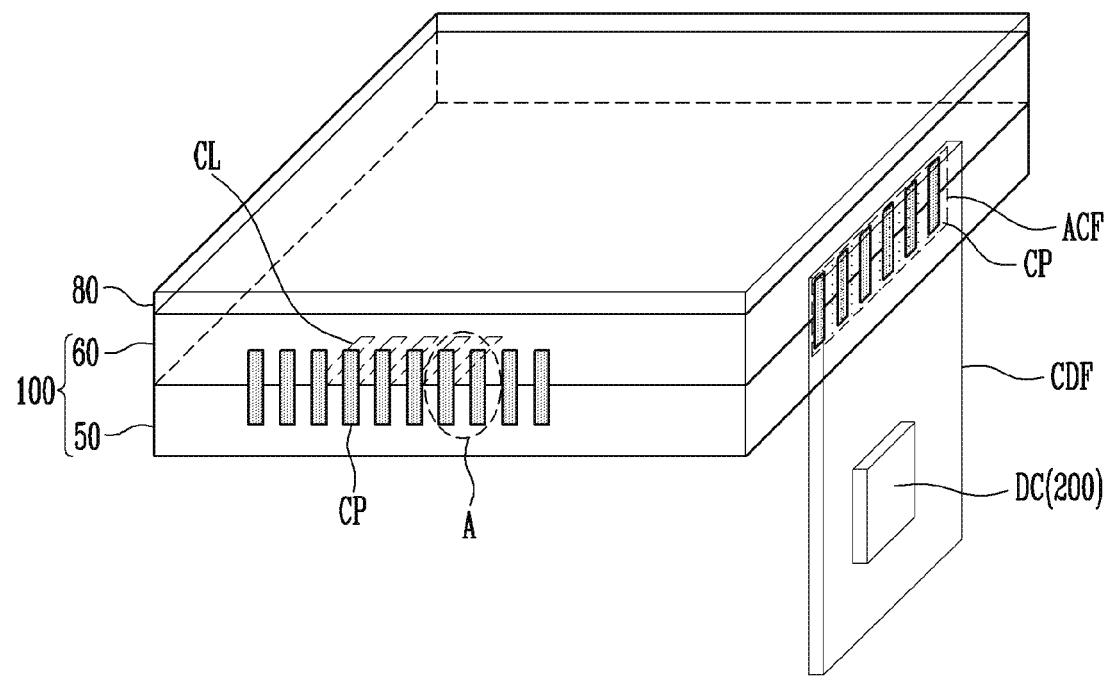

As shown in FIG. 13, an anisotropic conductive film ACF may be attached to the side conductive patterns CP, and the driving circuit 200 and a printed circuit board (PCB) may be electrically connected to the side conductive patterns CP (e.g., via an outer lead bonding (OLB) process) (S500).

In an exemplary embodiment of the inventive concept, a plurality of anisotropic conductive films ACF may be attached to one side surface of the display panel 100 at predetermined intervals. The display panel 100 may be electrically connected to the driving circuit 200 through the side bonding method. In other words, the anisotropic conductive film ACF, the printed circuit board, and the like are not arranged (or bonded) on the upper surface of the display panel 100.

The side conductive patterns CP may be attached to a first portion of each anisotropic conductive film ACF. The conductive film CDF including conductive lines and the driving circuit 200 may be attached to a second portion of each anisotropic conductive film ACF. The driving circuit 200 may include at least one of the timing controller 220, the gate driver 240, and the data driver 260. The timing controller 220, the gate driver 240, and the data driver 260 may be implemented as a driving IC (integrated circuit) chip, an integrated circuit, or the like.

However, this is merely an example, and the form and configuration of the driving circuit 200 are not limited thereto. For example, at least one of the timing controller 220, the gate driver 240, and the data driver 260 may be integrated in the display panel 100.

The driving circuit 200 may be electrically connected to an external control device, a processor, or the like through a PCB or the like.

As described above, the display device 1000 and the method of manufacturing the same according to exemplary embodiments of the inventive concept may significantly reduce the width of the bezel for the OLB process by eliminating the step between the display panel 100 and the polarizing layer 80 by the laser cutting and polishing processes. In addition, since the side conductive patterns CP are precisely formed by an ultrafine laser patterning, an ultra-high resolution large display of UHD or higher may be realized.

The conductive film CDF (e.g., the conductive layer CDL) having uniform thickness and area is bonded to the side surface of the display panel 100 at a high temperature and a high pressure so that the adhesion force and adhesion between the connection lines CL of the display panel 100 and the conductive layer CDL may be improved and the flatness of the conductive layer CDL may be improved. Therefore, in the display device 1000 to which the side bonding method is applied, the electrical connection between the display panel 100 and the driving circuit 200 may be improved and process reliability may be improved.

Further, due to the method of manufacturing the display device in which the conductive film CDF (e.g., the conductive layer CDL) having uniform thickness and area is bonded to the side surface of the display panel 100 at a high temperature and a high pressure, process speed and yield may be improved.

Figure 14:
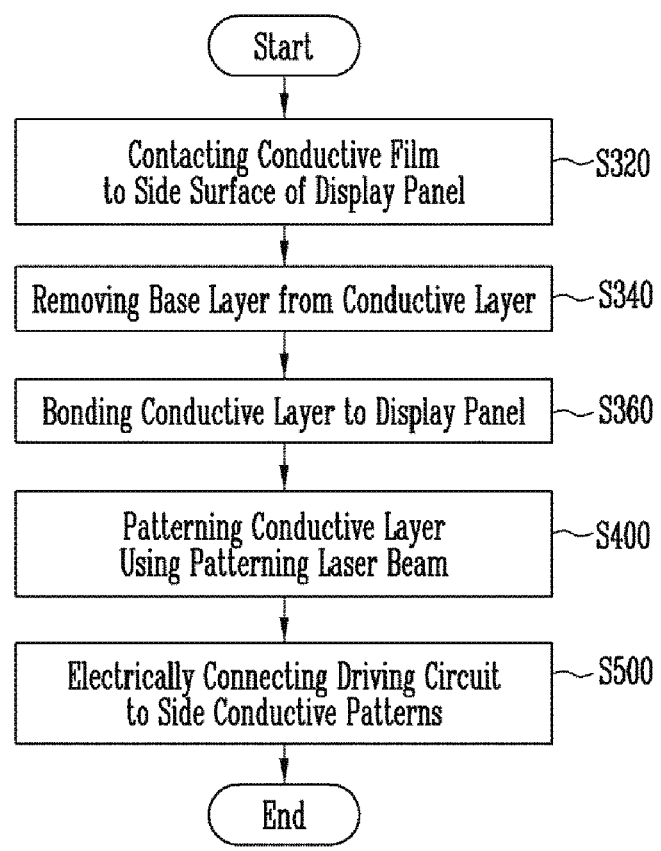
FIG. 14 is a flowchart illustrating a method of manufacturing a display device according to an exemplary embodiment of the inventive concept.
Figure 15:
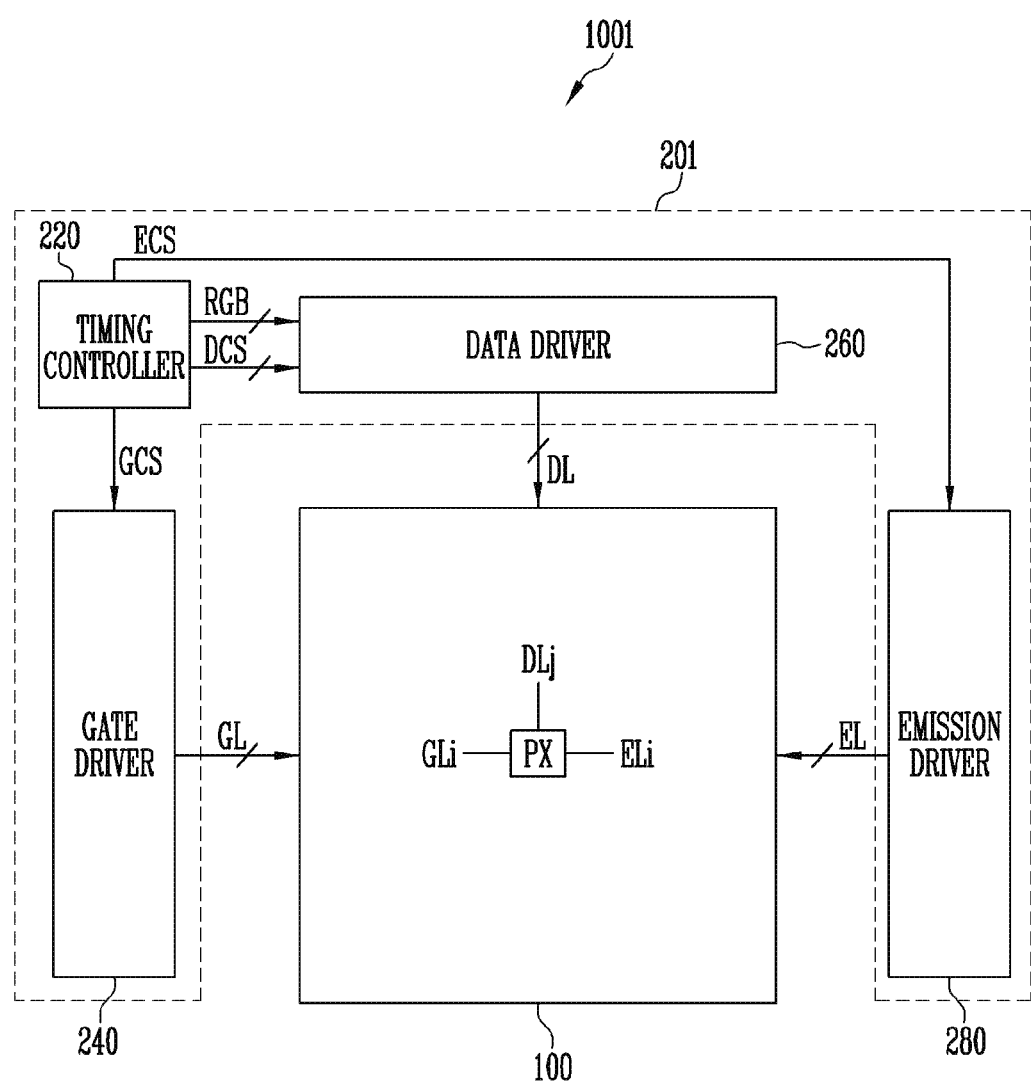
FIG. 15 is a block diagram illustrating a display device according to an exemplary embodiment of the inventive concept.

FIG. 14 is a flowchart illustrating a method of manufacturing a display device according to an exemplary embodiment of the inventive concept. FIG. 15 is a block diagram illustrating a display device according to an exemplary embodiment of the inventive concept.

In descriptions of FIGS. 14 and 15, the same reference numerals denote the same elements described with reference to FIGS. 1 and 2, and a duplicate description of the same elements will be omitted. In addition, a display device 1001 of FIG. 15 may have substantially the same or similar configuration as the display device 1000 of FIG. 2, except that the display device 1001 is not a liquid crystal display device.

Referring FIGS. 14 and 15, the display device 1001 may include the display panel 100 and a driving circuit 201.

As shown in FIG. 15, the display device 1001 may include the plurality of gate lines GL and a plurality of emission control lines EL extending in the first direction. The plurality of data lines DL extending in the second direction intersecting the first direction may be disposed on the display panel 100.

Each pixel PX of the display panel 100 may include at least one thin film transistor, a storage capacitor, and a self-light emitting element. In an exemplary embodiment of the inventive concept, the self-light emitting element may be an organic light-emitting diode or an inorganic light-emitting device.

The driving circuit 201 may include the timing controller 220, the gate driver 240, the data driver 260, and an emission driver 280.

The timing controller 220 may generate an emission drive control signal ECS for controlling the emission driver 280 in response to the control signals.

The emission driver 280 may sequentially select the emission control lines EL in response to the emission drive control signal ECS supplied from the timing controller 220 and may output a turn-on voltage to the selected emission control line.

A pixel connected to the selected emission control line may emit light in response to the turn-on voltage.

In an exemplary embodiment of the inventive concept, the display device 1001 may not include a polarizing layer, a backlight, or the like.

As shown in FIG. 14, a method of manufacturing the display device may include an operation of attaching a conductive film to at least one side surface of the display panel on which the pixel PX including the thin film transistor and the self-light emitting element is provided (S320, S340, and S360), an operation of patterning the conductive film using a laser beam to form a plurality of side conductive patterns electrically connected to the pixel PX (S400), and an operation of attaching an anisotropic conductive film to the side conductive patterns to electrically connect the driving circuit 201 to the side conductive patterns (S500).

In an exemplary embodiment of the inventive concept, an operation of attaching the conductive film to the side surface of the display panel 100 may include an operation of pressing the conductive film having a conductive layer and a base layer on the conductive layer with a first pressure at a first temperature so that the conductive film contacts the side surface of the display panel (S320), an operation of removing the base layer from the conductive layer (S340), and an operation of pressing the conductive layer with a second pressure at a second temperature to bond the conductive layer to the side surface of the display panel (S360). Since the operations S320 to S360 have been described with reference to FIGS. 7 through 10B, a duplicate description will be omitted.

The operations of forming the side conductive patterns (S400) and electrically connecting the driving circuit 201 to the side conductive patterns (S500) have been described above with reference to FIGS. 11 through 13, and thus a duplicate description will be omitted.

As described above, the method of manufacturing the display device according to exemplary embodiments of the inventive concept may be applied to various display devices such as an organic light emitting display device as well as a liquid crystal display device.

Figure 16:
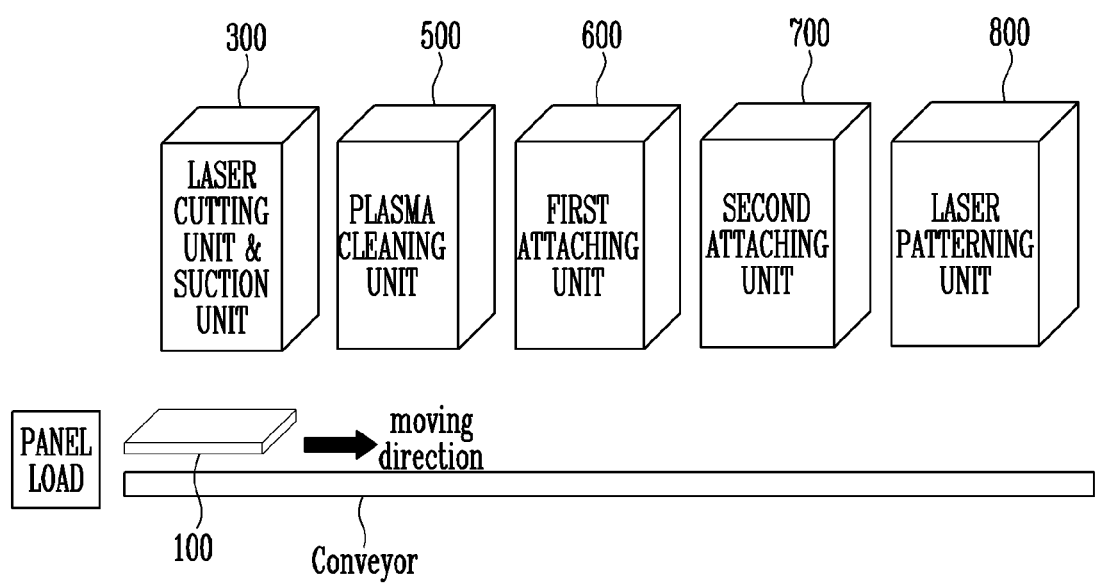
FIG. 16 is a schematic view illustrating a facility for performing the method of manufacturing the display device of FIG. 1 according to an exemplary embodiment of the inventive concept.

FIG. 16 is a schematic view illustrating a facility for performing the method of manufacturing the display device of FIG. 1 according to an exemplary embodiment of the inventive concept.

Referring to FIGS. 1 to 12 and 16, the method of manufacturing the display device may be performed by an in-line process. In other words, a process of loading the display panel 100, a process of patterning the side conductive patterns CP, an OLB process, and an unloading process may be performed automatically and collectively.

In an exemplary embodiment of the inventive concept, a facility for manufacturing the display device 1000 may include the laser cutting device 300, the plasma cleaning apparatus 500, a first attaching unit 600 (e.g., pressing unit or pressing apparatuses described above), a second attaching unit 700 (e.g., pressing unit or the bonding apparatus 700 described above), and a laser patterning unit 800. The facility may further include an autoclave unit for attaching the polarizing layer 80 and the display panel 100.

The display panel 100 may be transported along a transport line (e.g., a conveyor) in a direction (or moving direction) substantially parallel to the upper surface of the display panel 100. As the display panel 100 is transported, the operation of attaching the polarizing layer 80A (S100), the operation of cutting the polarizing layer 80A (S200), the operation of cleaning the side surface of the display panel 100, the operation of bonding the conductive film CDF to the side surface of the display panel 100 (S300), and the operation of patterning the conductive film CDF to form the side conductive patterns CP (S400) may be sequentially performed.

As described above, the display device and the method of manufacturing the same according to exemplary embodiments of the inventive concept may greatly reduce the width of the bezel (zero-bezel implementation) for the side OLB process by eliminating the step between the display panel and the polarizing layer through laser cutting and polishing. In addition, since the side conductive patterns are precisely formed by ultrafine laser patterning, an ultrahigh resolution large display with a UHD resolution or higher may be realized.

Further, since the conductive film (e.g., the conductive layer) having uniform thickness and area is bonded to the side surface of the display panel at a high temperature and a high pressure, the adhesive strength and adhesion between the connection lines of the display panel and the side conductive patterns may be improved and the flatness of the side conductive patterns may be improved. Accordingly, the electrical connection between the display panel 100 of the display device 1000, to which the side bonding method is applied, and the driving circuit 200 is improved, and process reliability may be improved.

Furthermore, the process speed and yield may be improved due to the method of manufacturing the display device which bonds the conductive film (e.g., the conductive layer) having uniform thickness and area to the side surface of the display panel 100 at a high temperature and a high pressure.

While the inventive concept has been shown and described with reference to exemplary embodiments thereof, it will be apparent to those of ordinary skill in the art that various modifications in form and details may be made thereto without departing from the spirit and scope of the inventive concept as set forth by the appended claims.

What is claimed is:

1. A method of manufacturing a display device, the method comprising:

disposing a polarizing layer on one surface of a display panel including a thin film transistor and a pixel electrode;

cutting the polarizing layer using a first laser beam so that a step between a side surface of the polarizing layer and a side surface of the display panel is smaller than a predetermined value;

attaching a conductive film to the side surface of the display panel; and patterning the conductive film using a second laser beam, wherein the attaching of the conductive film includes bonding the conductive film to the side surface of the display panel under a predetermined temperature and a predetermined pressure condition.

2. A method of manufacturing a display device, comprising:

disposing a polarizing layer on one surface of a display panel including a thin film transistor and a pixel electrode;

cutting the polarizing layer using a first laser beam so that a step between a side surface of the polarizing layer and a side surface of the display panel is smaller than a predetermined value;

attaching a conductive film to the side surface of the display panel; and patterning the conductive film using a second laser beam, wherein the attaching of the conductive film comprises:

pressing a conductive layer and a base layer on the conductive layer with a first pressure at a first temperature so that the conductive film contacts the side surface of the display panel, wherein the conductive layer and the base layer constitute the conductive film;

removing the base layer from the conductive layer; and pressing the conductive layer with a second pressure at a second temperature to bond the conductive layer to the side surface of the display panel.

3. The method of claim 2, wherein the second temperature is higher than the first temperature.

4. The method of claim 2, wherein the second pressure is higher than the first pressure.

5. The method of claim 2, wherein the conductive layer is bonded to the side surface of the display panel by a bonding apparatus including a heating unit heated to the second temperature and a pressing unit in the form of a bar for pressing the conductive film with the second pressure.

6. The method of claim 2, wherein a pressing apparatus in the form of a roller or a bar presses the conductive film with the first pressure at the first temperature so that the conductive film contacts the side surface of the display panel.

7. The method of claim 3, wherein the conductive layer includes at least one selected from silver (Ag), copper (Cu), gold (Au), and aluminum (Al).

8. The method of claim 1, wherein the display panel further includes:

a common electrode disposed on the pixel electrode; and a color filter disposed on the common electrode.

9. The method of claim 8, wherein patterning the conductive film forms a plurality of side conductive patterns electrically connected to at least one of the thin film transistor, the pixel electrode, the common electrode, and the color filter.

10. The method of claim 9, wherein a distance between the plurality of side conductive patterns is 30 μm or less.

11. The method of claim 9, further comprising:

attaching an anisotropic conductive film to the plurality of side conductive patterns so that a driving circuit and a printed circuit board are electrically connected to the plurality of side conductive patterns.

12. The method of claim 1, wherein cutting the polarizing layer comprises:

inhaling impurities generated in response to cutting the polarizing layer; and cleaning the side surface of the display panel with atmospheric pressure plasma.

13. The method of claim 1, further comprising:

conveying the display panel in a direction substantially parallel to the one surface of the display panel along a predefined conveyor line, wherein, as the display panel is being conveyed, the polarizing layer is disposed on the one surface of the display panel, the polarizing layer is cut, the conductive film is attached on the side of the display panel, and the conductive film is patterned in sequential order.

14. A method of manufacturing a display device, the method comprising:

attaching a conductive film to at least one side surface of a display panel by bonding the conductive film to the at least one side surface of the display panel under a predetermined temperature and a predetermined pressure condition, wherein the display panel includes a pixel including a thin film transistor and a light emitting element;

patterning the conductive film using a laser beam to form a plurality of side conductive patterns electrically connected to the pixel; and attaching an anisotropic conductive film to the plurality of side conductive patterns to electrically connect a driving circuit to the plurality of side conductive patterns.

* * * * *